US009640279B1

(12) United States Patent
Popps et al.

(10) Patent No.: US 9,640,279 B1
(45) Date of Patent: May 2, 2017

(54) APPARATUS AND METHOD FOR BUILT-IN TEST AND REPAIR OF 3D-IC MEMORY

(75) Inventors: Donovan Popps, Austin, TX (US); Amjad Qureshi, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 1151 days.

(21) Appl. No.: 13/611,109

(22) Filed: Sep. 12, 2012

(51) Int. Cl.
*G11C 29/00* (2006.01)
*G11C 29/16* (2006.01)
*G11C 29/44* (2006.01)

(52) U.S. Cl.
CPC .......... *G11C 29/16* (2013.01); *G11C 29/4401* (2013.01)

(58) Field of Classification Search
CPC .... G06F 11/167; G06F 11/1666; G06F 11/27; G11C 29/16; G11C 29/14; G11C 29/12; G11C 29/4401; G11C 29/44; G11C 29/76; G11C 2229/746
See application file for complete search history.

(56) References Cited

U.S. PATENT DOCUMENTS

| | | | | | |
|---|---|---|---|---|---|
| 6,317,846 | B1* | 11/2001 | Higgins | ................. | G11C 29/44 714/30 |
| 6,691,264 | B2* | 2/2004 | Huang | .................. | G11C 29/24 365/201 |
| 6,728,910 | B1* | 4/2004 | Huang | .................. | G11C 29/16 365/200 |
| 7,284,166 | B2* | 10/2007 | Zappa | .................... | G11C 29/16 714/710 |
| 8,055,966 | B1* | 11/2011 | Sogani | .......... | G01R 31/318513 714/718 |

* cited by examiner

*Primary Examiner* — Andrew Q Tran
(74) *Attorney, Agent, or Firm* — Rosenberg, Klein & Lee

(57) ABSTRACT

A system-on-chip (SOC) (10) is interfaced with a memory (20) formed by a plurality of stacked memory integrated circuit dies (20a-20n). The SOC (10) includes a memory controller (100) that has a built-in self-test (BIST) system (1000) for performing the testing and repair of memory (20). BIST system (1000) includes a microcode processor (1130) that communicates externally to the SOC (10) through a Joint Test Action Group interface (120) and is coupled to a BIST state machine (1140) for executing a memory specific test sequence to detect faults in memory (20). The microcode processor (1130) further communicates with a repair state machine (1150) to execute memory specific repair procedures responsive to memory faults being detected.

10 Claims, 4 Drawing Sheets

APPARATUS AND METHOD FOR BUILT-IN TEST AND REPAIR OF 3D-IC MEMORY

BACKGROUND OF THE INVENTION

Field of the Invention

This disclosure directs itself to a system-on-chip having a built-in self test and repair function for use with a memory formed by a plurality of stacked memory integrated circuit dies connected to the system-on-chip. In particular, the disclosure is directed to a system-on-chip having a memory controller that tests the memory connected to the system-on-chip and repairs faults detected by those tests. More in particular, the disclosure pertain s to a memory controller having a built-in self-test module system for testing the memory for defects and repair of the memory by substitution of redundant memory portions for those portions identified as being defective. Further, the disclosure relates to a built-in self-test system of a memory controller that includes a control processor and a first state machine sending data to the memory and reading data from the memory in sequential steps to test the memory for defective portions thereof responsive to commands from the control processor. Still further, the disclosure concerns a built-in self-test system that includes a first state machine sending data to the memory and reading data from the memory in sequential steps to test the memory for defective portions thereof, and a second state machine for executing sequential repair steps to replace the defective memory portions with redundant portions provided in the memory responsive to commands from the control processor. Additionally, the disclosure is directed to a method for configuring a system-on-chip for testing and repair of a 3D-IC memory connected thereto.

Prior Art

Traditionally, semiconductor memory chips have been subject to post-fabrication testing by the semiconductor manufacturer to detect defective memory elements that occur in chip fabrication with some regularity. As it is not economically feasible to reject all chips found to include any defective memory elements, on-chip repair techniques were developed to improve production yield. A commonly used on-chip repair technique uses the concept of replacing defective memory elements in a chip with spare memory elements that are also included in the chip. As memory arrays are made up of memory elements identified by rows and columns and may also be subdivided into multiple blocks. Redundant rows, columns and/or blocks are added to the memory integrated circuit die to accommodate the replacement of bad elements. Subsequent to substitution of redundant memory elements for those found to be defective, the semiconductor manufacturer would package the integrated circuit die and ship the memory to a customer.

The development and growth of system-on-chip architectures and the need for higher speed systems has led to unpackaged memory integrated circuit dies being mounted directly on system-on-chip substrates and the use of built-in self-test circuitry incorporated in the system-on-chip to identify assembly defects. With the need for increases in memory capacity and density unpackaged memory integrated circuit dies are now stacked on the system-on-chip and interconnected through vias formed in the integrated circuit substrates. This process creates new opportunities for introducing defects in the memory array and requires post assembly testing that duplicates many of the post-fabrication testing done by the semiconductor manufacturer. It would therefore be more efficient to expand the capability of the built-in self-test function to perform the testing that heretofore was performed by the semiconductor manufacturer and add the repair capability as well. However, as each semiconductor manufacturer uses their own selection of tests to detect faults and their own procedures to substitute redundant memory elements, and different types of memory circuits require different tests to detect faults as well, any built-in self-test and repair capability incorporated into a system-on chip must be able to accommodate various memory types and memory integrated circuit dies and memory integrated circuit dies from multiple sources.

SUMMARY OF THE INVENTION

A memory controller for use in a system-on-chip architecture connected to a memory formed by a plurality of stacked memory integrated circuit dies is provided. The memory controller includes an interface configured for coupling with the memory through a physical interface circuit. The memory controller includes a built-in self-test system for testing the memory for defects and repair of the memory. The built-in self-test system enables substitution of defective portions of the memory identified by the testing with redundant portions thereof.

From another aspect, a built-in self test module of a memory controller for use with a memory formed by a plurality of stacked memory integrated circuit dies is also provided. The built-in self-test system includes a control processor and a first state machine sending data to the memory and reading data from the memory in sequential steps to test the memory for defective portions thereof responsive to commands from the control processor. The built-in self-test system further includes a second state machine for executing sequential repair steps to replace the defective memory portions with redundant portions provided in the memory responsive to commands from the control processor.

From yet another aspect, A system-on-chip is provided having a built-in self test and repair function for use with a memory formed by a plurality of stacked memory integrated circuit dies. The system-on-chip includes a processor, and a physical interface coupled to the memory. The system-on-chip further includes a memory controller coupled to said processor and said physical interface. The memory controller includes a built-in self-test module for testing the memory for defects and repair of the memory by enabling substitution of redundant portions of the memory for those portions thereof identified as being defective by the testing.

From still a further aspect, a method is provided for configuring a system-on-chip (SOC) for testing and repair of a memory associated therewith that is formed by a plurality of stacked memory integrated circuit dies. The method includes the steps of providing a memory controller on the SOC interfaced with the memory, and the memory controller sends write and read instructions to a sequence of addresses of the memory as at least one test thereof. The method also includes the step of analyzing results of the read instructions to detect defective portions of the memory. Further, the method includes the step of determining whether the memory can be repaired by replacement of the defective portions with corresponding redundant portions of the memory responsive to defective portions of the memory being detected. Still further, the method includes the step of the memory controller sends instructions to the memory to disable the detected defective portions and enable the corresponding redundant portions, if corresponding redundant portions of the memory are available for substitution for the detected defective portions.

DESCRIPTION OF THE PREFERRED EMBODIMENTS

Referring to FIGS. 1-4, there is shown a system-on-chip (SOC) 10 interfaced with an external memory 20 formed by a three-dimensional integrated circuit (3D-IC) having a plurality of stacked memory integrated circuit dies 20a-20n and configured to test memory 20 and execute repair thereof. As will be seen in following paragraphs, SOC 10 includes a memory controller 100 incorporating the logic for testing memory 20, analyzing the test results and performing necessary repairs by substitution of redundant memory rows or columns for the detected defective portions of memory 20. The test and repair functionality of memory controller 100 has application for use with various types of dynamic random access memory (DRAM), as well as electrically programmable types of non-volatile memory including flash memory. While the test and repair functionality of memory controller 100 is applicable for use with two-dimensional integrated circuit memories, it is particularly advantageous for use in with 3D-IC memories, where stacked memory integrated circuit dies are interconnection through vias, combined with chip-on-board technology introduces the potential for failure modes not detectable by the manufacturer of the integrated circuit dies.

Figure 1:
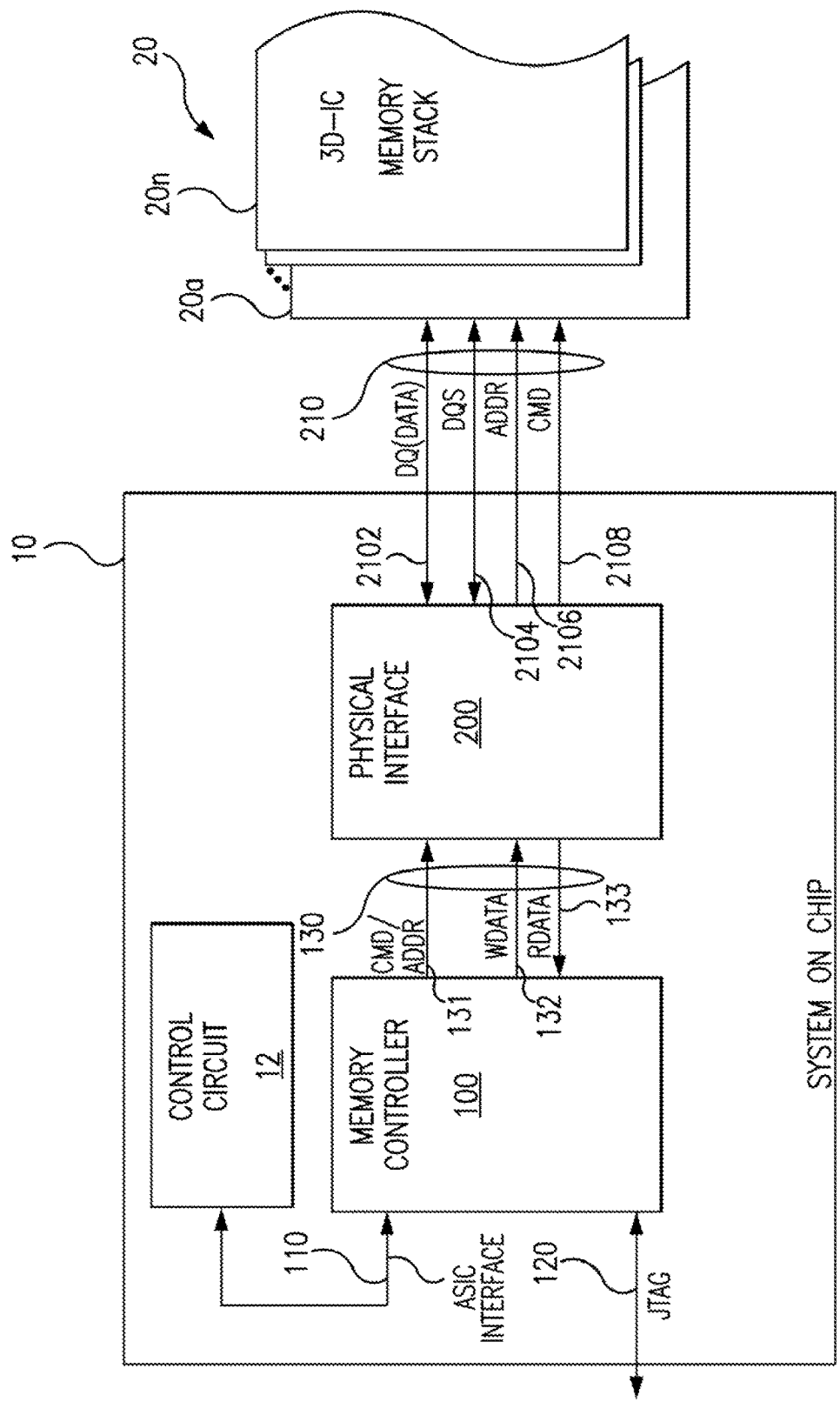
FIG. 1 is a functional block diagram illustrating a system-on-chip interfaced with a three-dimensional integrated circuit memory and incorporating the present invention.

Referring now to FIG. 1, the SOC 10 is shown connected to the 3D-IC memory 20 through an interface 210 comprised of a plurality of buses. SOC 10 includes a conventional physical interface (PHY) 200 that interfaces memory controller 100 with the memory 20. PHY 200 interfaces with the memory 20 with such busses as a DQ (data) bus 2102, DQS (strobe) bus 2104, address bus 2106 and command bus 2108. PHY 200 interfaces with memory controller 100 through the interface 130 which includes a memory command/address bus (MEM CMD/ADDR) 131, memory write data bus (MEM WDATA 132 and memory read data bus (MEM RDATA) 133. As the PHY 200 and its interfaces 130 and 210 are conventional, no further description thereof need be provided to understand the operation of the memory test and repair functions of memory controller 100. SOC 10 will include many other circuits other than those illustrated in FIG. 1 to carry out the functions for which it is designed. However, as those functions the associated circuits therefore are extraneous to the systems and methods being disclosed and claimed herein, they are not shown in the drawings nor discussed in any further detail, other than it should be understood that SOC 10 includes many logic and/or driver circuits in addition to those specifically described in following paragraphs.

SOC 10 may include at least one control circuit 12, which may be a central processing unit, a graphics processor, a signal processor, an application specific integrated circuit, a direct memory access controller or other general purpose or specialized processor needed to carry out the function to which SOC 10 is directed. The control circuit 12 may be coupled to other logic circuits, such as input/output interface circuits (not shown) and/or on-chip non-volatile memory (not shown), as well as memory controller 100, through conventional interfaces. Memory controller 100 is coupled to the at least one control circuit 12 through a corresponding application-specific integrated circuit (ASIC) interface 110. Memory controller 100 is coupled to devices external to SOC 10 through a Joint Test Action Group (JTAG) interface 120, that in addition to its conventional test applications is used in conjunction with the memory test and repair functions of memory controller 100.

Figure 2:
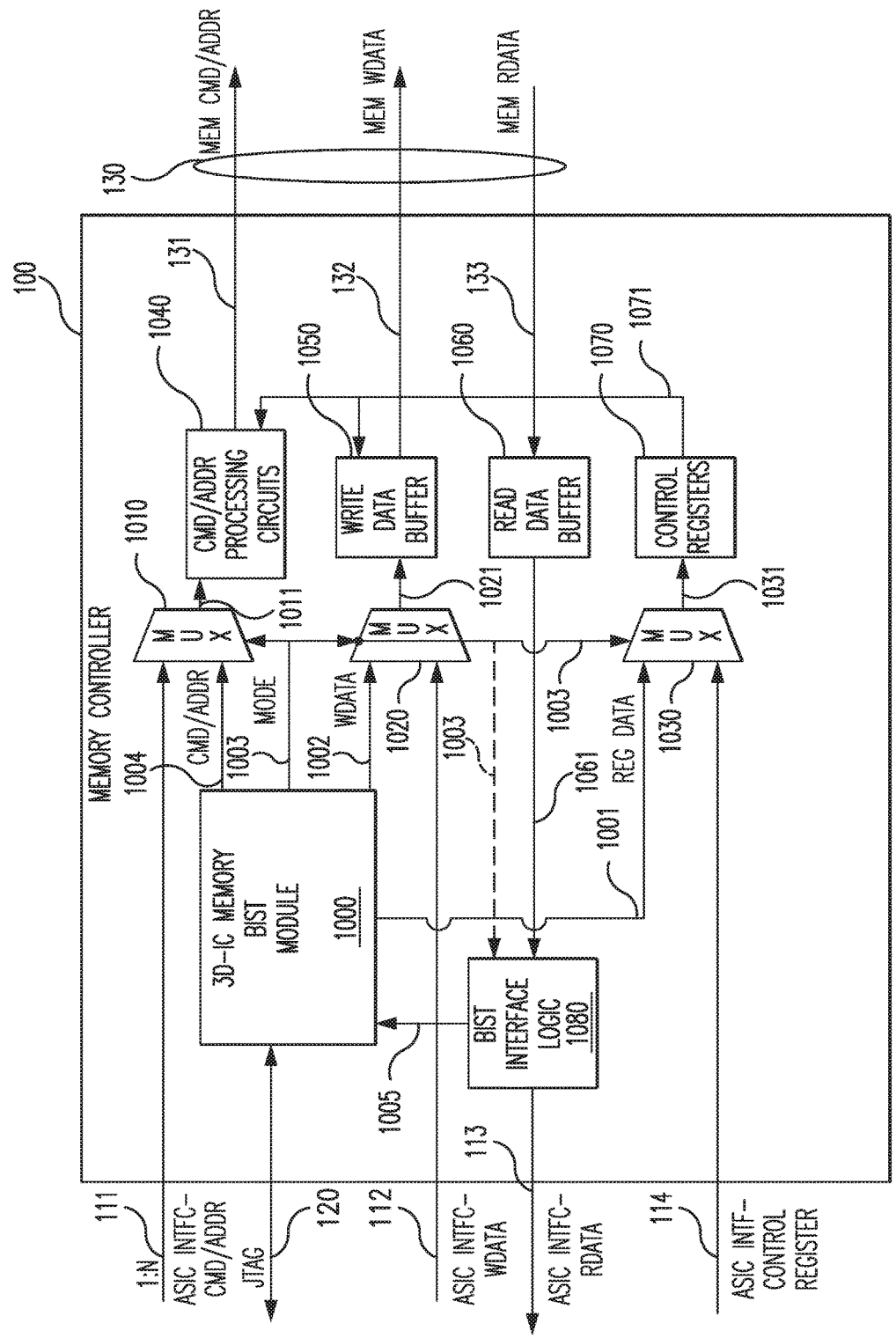
FIG. 2 is a functional block diagram illustrating a memory controller of the present invention.

Referring now to FIG. 2, there is shown a functional block diagram of the memory controller 100 with respect to the test and repair of 3D-IC memory 20 shown in FIG. 1. For clarity, those features of a conventional memory controller that are not affected by the addition of the test and repair functions described herein, are not shown in the figure or described herein since they are well known in the art and not necessary to understand and use the concepts being set forth. Communication with the PHY 200 through the interface 130 is accomplished using the functional blocks 1040, 1050, 1060 and 1070. Commands and addresses are translated from the protocol of the particular application hardware, firmware, and/or software of the SOC 10 to be compliant with the Joint Electron Device Engineering Council (JEDEC) on the output bus 131 by the command/address processing circuits 1040. The write data buffer 1050 and read data buffer 1060 are first-in, first-out (FIFO) memories respectively coupled to the buses 132 and 133. The control registers 1070 contain data used to initialize the memory 20, such as data to be transferred to the memory's mode register and extended mode register. The data in the control registers 1070 is transferred to the memory through buses 131 and 132 through the functional blocks 1040 and 1050 which receive the data on bus 1071.

As will be described, the data transferred to PHY 200 through the interface 130 is either supplied from the ASIC interfaces 110 or the 3D-IC memory built-in self-test (BIST) module or system 1000. ASIC interface address and command data is supplied by the bus 111 to a multiplexor (MUX) 1010, which also receives address and command data from the 3D-IC memory BIST module 1000 through the bus 1004. The 3D-IC memory BIST module 1000 outputs a mode control signal on line 1003 to control the switching of the output of MUX 1010 between the two inputs. Thus, during a test mode initiated by the 3D-IC memory BIST module 1000, the address and command data supplied from 3D-IC memory BIST module 1000 on bus 1004 is output to the command/address processing circuits 1040. Likewise, the ASIC interface write data is supplied to the MUX 1020 by bus 112. MUX 1020 also receives test write data from the 3D-IC BIST module 1000 the bus 1002 and is switched between the two inputs by the mode control signal on line 1003. MUX 1020 provides the write data to the write data buffer 1050 through bus 1021. The ASIC interface control register data is input to MUX 1030 through the bus 114 and the test control register data from 3D-IC memory BIST module 1000 on bus 1001. Here again, the mode signal provided on line 1003 switches MUX 1030 between the two inputs to output bus 1031 coupled to control registers 1070. The read data output from the read data buffer 1060 is input to the BIST interface logic 1080 by bus 1061. The read data may be supplied to both the 3D-IC memory BIST module 1000 on bus 1005 and the ASIC interface read data bus 113 or optionally, be selectively switched therebetween responsive to the mode signal which then would be supplied on line 1003.

The test and repair of memory 20 is carried out by the 3D-IC memory BIST module 1000. As the testing and repairs carried out by the 3D-IC memory BIST module 1000 of the memory controller 100 is intended to replace or supplement those functions which heretofore have been carried out by the memory integrated circuit manufacturers, the test and repair procedures must comply with those of those manufactures and be appropriate for the type of memory devices that form memory 20. As the information as to what manufacturer's chips and/or what type of memory is being used with memory controller 100, the JTAG interface 120 coupled to the 3D-IC memory BIST module 1000 provides the means to supply memory type and/or manufacturer specific test and repair sequence data thereto. The JTAG interface also provides the means to initiate the test and repair of the memory 20.

Figure 3:
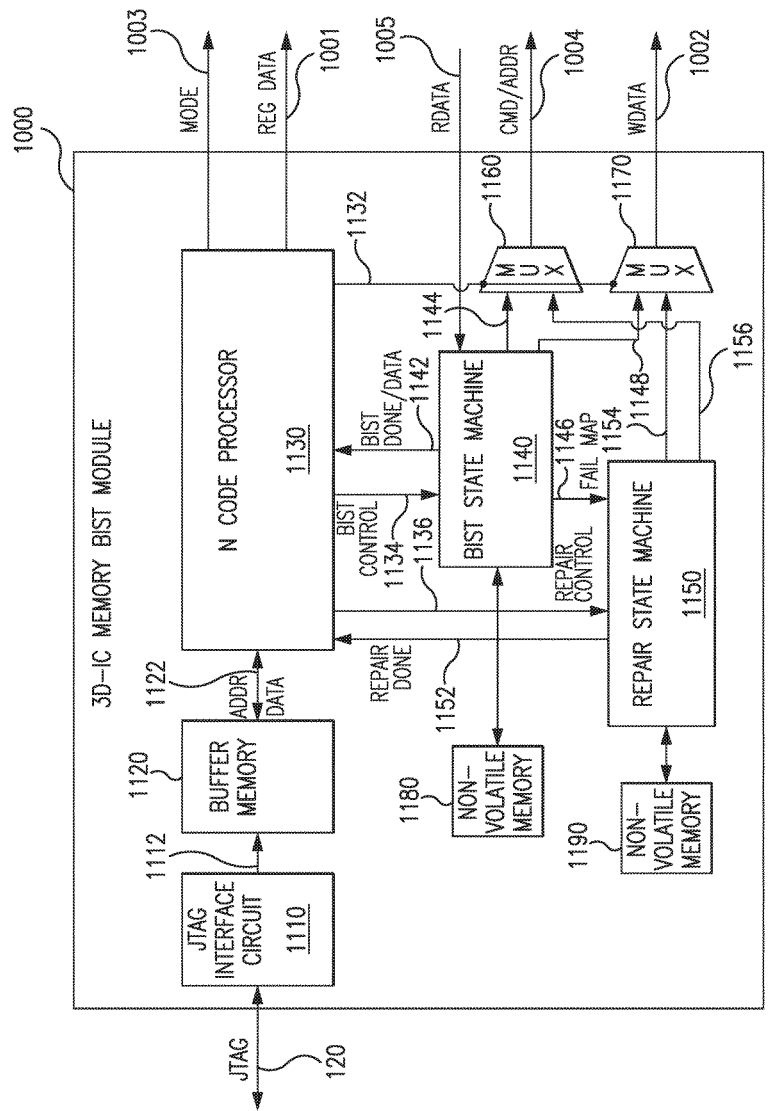
FIG. 3 is a functional block diagram illustrating a three-dimensional integrated circuit memory built-in self-test module of the present invention.

Referring to FIG. 3, there is shown a functional block diagram of the 3D-IC memory BIST module 1000. 3D-IC memory BIST module 1000 includes a micro-code processor 1130 that controls the operation of 3D-IC memory BIST module 1000 and receives and communicates data external to SOC 10 through JTAG interface 120. JTAG interface 120 connects to the JTAG interface circuit 1110 which includes the conventional JTAG architecture required to comply with the JTAG interface standard. JTAG interface circuit 1110 connects to the buffer memory 1120 to which micro-code processor 1130 is connected and from which the micro-code processor 1130 reads instructions transmitted through the JTAG interface 120.

The requirements for a JTAG interface are prescribed by the I.E.E.E. Standard 1149.1. That standard defines a relatively small number of instruction codes transmitted over the interface, leaving a large number of codes available for proprietary use. Thus, the JTAG interface provides an ideal vehicle for communications between the 3D-IC memory BIST module 1000 and external systems for testing that goes beyond the conventional boundary scan testing for which the JTAG interface had been developed and beyond the conventional built in self-testing that has heretofore been incorporated in memory controllers. As will be described in following paragraphs, instructions and data that allows the testing and repair of the memory 20 to be adapted to the particular memory integrated circuit dies 20a-20n that form memory 20 are transmitted by JTAG interface 120, stored in the buffer memory 1120 and then accessed by microcode processor 1130.

Microcode processor 1130 outputs the mode control signal on line 1003, which, as previously discussed, switches the multiplexers 1010, 1020 and 1030, and optionally the BIST interface logic 1080 between memory test and memory control modes. Microcode processor 1130 also outputs the register data on line 1001 for initialization of the memory 20 in the testing mode through the multiplexer 1030 and control registers 1070. To carry out the testing, 3D-IC memory BIST module 1000 includes a BIST state machine 1140 coupled to microcode processor 1130 by control and data buses 1134 and 1142. The BIST state machine 1140 is a sequential logic device that when initiated by microcode processor 1130, outputs memory command instructions, memory addresses and data to be written into memory 20, and received data read back from memory 20. BIST state machine 1140, however, may be implemented by a processor programmed to carry out event driven logic steps of a state machine. Command instructions and address data are output on the bus 1144 to a multiplexer 1160. The write data is output on a bus 1148 to another multiplexer 1170. Microcode processor 1130 controls the switching of multiplexers 1160 and 1170 by a control signal output on line 1132 to respectively transfer the command instructions and address data to memory on the bus 1004 and write data to bus 1002.

BIST state machine 1140 is coupled to a non-volatile memory 1180 in which test information is stored. Non-volatile memory 1180 may be organized as a look-up table that can structured in a number of ways. The testing carried out by BIST state machine 1140 was traditionally carried out by the semiconductor manufacturer before the memory integrated circuits were packaged. Each manufacturer have certain tests that they rely upon to detect particular types of failures, such as checkerboard, walking, marching and galloping test pattern tests. The manufacturers also usually require a particular sequence of those tests be carried out to provide adequate validation of the circuit's reliability and distinguish the source of detected faults, such as distinguishing faults in memory cell from those in an address decoder. Further, different types of memory circuits likewise require tests that may differ from those used for other types of memory circuit and the particular sequence of tests that are common to different types of memory circuits may vary as well.

One way of arranging the look-up table is to correlate sets of test sequences for the particular integrated circuit dies that are foreseen as being used to form memory 20 to corresponding command codes. Each set of test sequences is a combination of all of the test pattern algorithms that are specific to a particular integrated circuit die, based on its memory type and/or manufacturer. Microcode processor 1130 identifies a sequence of test pattern tests by transmitting a command code on bus 1134 to BIST state machine 1140 that are specific to the particular integrated circuit dies 20a-20n that form memory 20 and initiates the that testing. The particular manufacturer/memory type of memory integrated circuit dies 20a-20n that form memory 20 is identified to the microcode processor 1130 by data transmitted through the JTAG interface 120, using codes that are not defined in the JTAG Standard, and stored in buffer memory 1120.

Another arrangement of the look-up table in non-volatile memory 1180 is the combination of sets of instructions that define each particular memory test foreseen as being utilized with various memory integrated circuit dies and correlating each set with a corresponding command code. Each set of instructions represents one of the various tests that may be executed by BIST state machine 1140 to test any of the particular memory integrated circuit dies 20a-20n that may be used to form memory 20. In that way, each command specifies a particular test to be executed, which may include a memory retention test, a zero-one test, checkerboard pattern test, marching pattern test, walking pattern test, galloping pattern test, butterfly pattern test, moving inversion pattern test, surround disturb test, stuck-at test, transition test, destructive read test and the like. The sequence of test to be executed by BIST state machine 1140 is then defined by the sequence of test command codes transmitted from the microcode processor 1130 in accordance with the data transmitted to it via the JTAG interface 120. This scheme minimizes the proprietary information that is stored in non-volatile memory 1180, allowing the tests selected for the particular memory integrated circuit dies 20a-20n and the sequence of tests to be chosen by persons or devices located external to the SOC 10.

In yet another arrangement of the look-up table in non-volatile memory 1180, the individual steps that form each of the aforementioned tests that may be used by BIST state machine 1140 is correlated to particular command codes. With this arrangement, the tests can be "built to order" along with the particular sequence of tests that are performed by the BIST state machine 1140. BIST state machine 1140, responsive to the command codes received from microcode processor 1130, uses the look-up table in non-volatile memory 1180 to identify the test steps to be carried out in the sequence the commands are issued and thereby performs the required tests for the particular memory integrated circuit dies 20a-20n of memory 20.

The BIST state machine 1140, in carrying out the tests in accordance with the commands from microcode processor 1130, includes internal registers and buffers into which expected read data and the actual read data from bus 1005 are stored and subsequently compared to detect faults within memory 20. The fault data may be transmitted on bus 1142 to microcode processor 1130, which in turn may transmit that data external to the SOC 10 via the JTAG interface 120. Upon completion of the sequence of tests carried out by BIST state machine 1140, BIST state machine 1140 transmits a memory fault map to the repair state machine 1150 on line 1146.

Repair state machine 1150 is a sequential logic device that, like the BIST state machine 1140, may be implemented by a processor. Repair state machine 1150 is coupled to microcode processor 1130 by control and data buses 1136 and 1152. To carry out the substitution of redundant memory portions, which may be redundant rows, redundant columns, combinations of both redundant rows and columns, or redundant memory blocks, repair state machine 1150 includes a write data bus 1154 coupled to multiplexer 1170 and a command/address bus 1156 coupled to the multiplexer 1160. Repair state machine 1150 is coupled to a non-volatile memory 1190 in which repair information is stored. Non-volatile memory 1190, like non-volatile memory 1180, may be organized as a look-up table that can structured in several ways. The repair functions carried out by repair state machine 1150 has heretofore been carried out by the semiconductor manufacturer prior to the memory devices being packaged. Each manufacturer has repair procedures for "mapping" redundant memory portions in place of those identified as being faulty, as well as an arrangement of fuses to be "blown" to disable subsequent repair of the chips, once the repair procedures have been completed. The interconnection of the individual memory integrated circuit dies in the stacked arrangement of memory 20 may be subject to faults that may or may not be repairable by substitution of redundant memory portions, which analysis must be performed by repair state machine 1150.

The look-up table embodied in non-volatile memory 1190, not unlike that in non-volatile memory 1180, may be arranged such that the repair procedures for substituting redundant rows/columns/blocks for each manufacturer are correlated with particular command codes transmitted on bus 1136 from the microcode processor 1130 that identify the manufacturer. The particular manufacturer of memory integrated circuit dies 20a-20n that form memory 20 is identified to the repair state machine 1150 by data transmitted through the JTAG interface 120, again, using codes that are not defined in the JTAG Standard, and stored in buffer memory 1120.

The look-up table in non-volatile memory 1190 may also be arranged so that a multiplicity of repair steps required for substituting various redundant portions of different manufacturer's memory integrated circuit dies are respectively correlated to particular command codes. With this arrangement, the data that is transmitted through the JTAG interface identifies a specific repair procedure to be executed by the identified sequence of commands transmitted to the repair state machine 1150. Here, as with non-volatile memory 1180, the amount of proprietary information stored in non-volatile memory 1190 is minimized. Following completion of the repair procedure, repair state machine 1150 signals the microcode processor 1130 of that condition on bus 1152. Microcode processor 1130 may then initiate a validation test or complete retest of memory 20.

Figure 4:
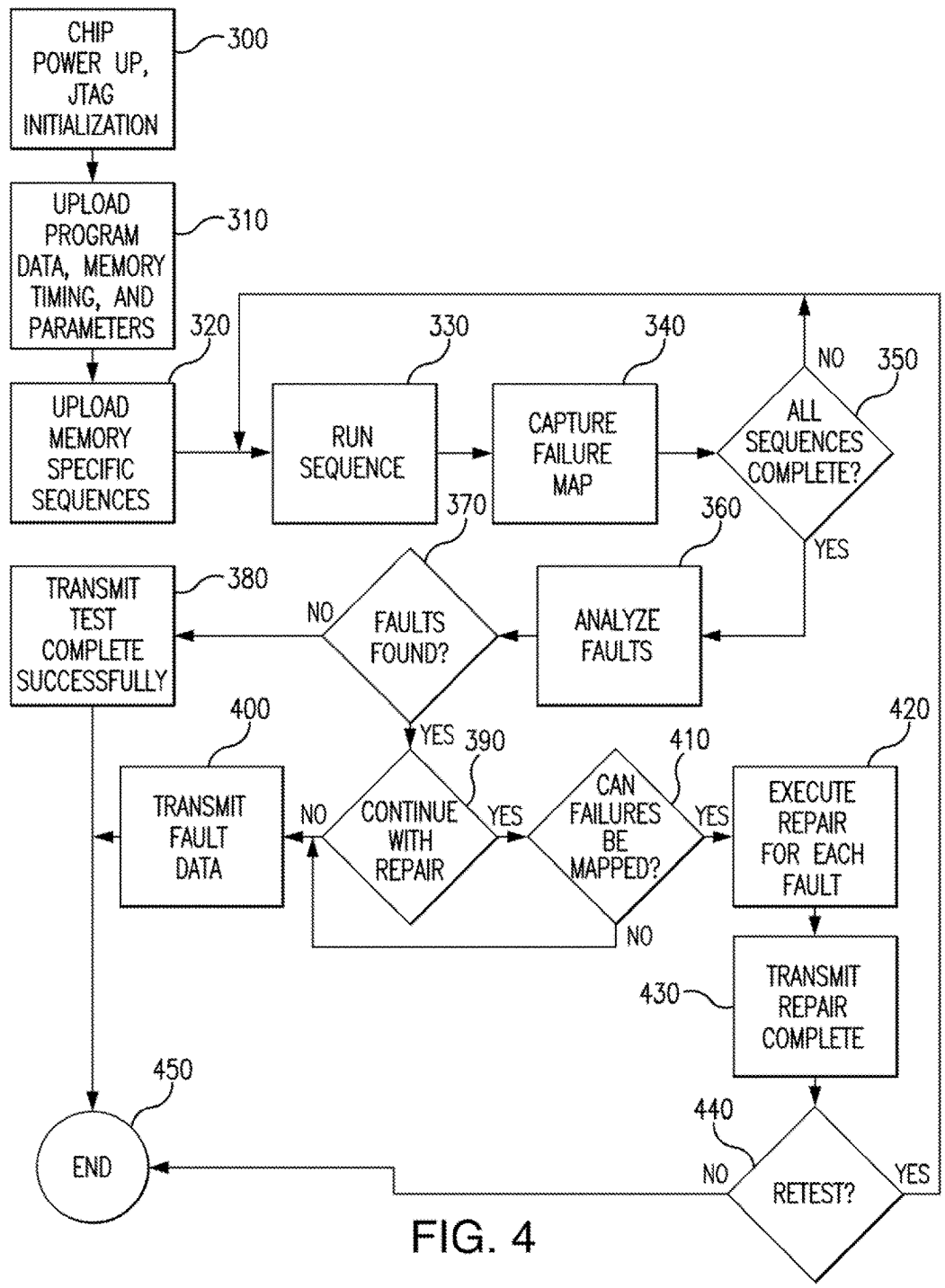
FIG. 4 is a flow chart of the test and repair method of the present invention.

Turning now to FIG. 4, there is shown a flow chart of the test and repair method employed by memory controller of SOC 10 for application to memory 20. In block 300 the SOC 10 is powered up and the JTAG interface is initialized, which includes such operations as clearing registers and setting clock rates. From block 300 the flow moves to block 310 where program data, memory timing settings and parameters (such as, row address to column address delay ($t_{RCD}$), row precharge time ($t_{RP}$), row active time ($t_{RAS}$), row cycle time ($t_{RC}$), etc.) are uploaded to the microcode processor 1130 through the JTAG interface 120. Next, the flow moves to block 320 where the test sequence data specific to the particular memory integrated circuit dies that form memory 20 is uploaded. As previously discussed, the particular test sequences may be stored in the non-volatile memory 1180 at any one of several levels of granularity, and the uploaded data are the addresses in the look-up table that identify the tests to be performed in accordance with the scheme used in storing the test algorithms. The uploaded data may further include start and ending addresses for non-volatile memory and data retention delay time.

The upload of the test sequence information, the flow transfers to block 330 were the step of executing the sequence of tests is carried out. The sequence of tests is carried out by the BIST state machine 1140, as described above. The next step following block 330 is the temporary storage of any failure data from the test upon completion of a test, in block 340. The flow then passes to the step of determining whether all of the tests of the particular sequence of tests have completed, in decision block 350. If there is still a test in the sequence to be run, then the flow transfers back to block 330 to run the test. If, however, all of the tests of the sequence of tests have been completed, the analysis of any faults found is carried out in block 360, which step is carried out in the repair state machine 1150.

From block 360 the flow passes to decision block 370 where, if no faults were detected by the sequence of tests, the flow passes to block 380 where data representing the successful completion of the test sequence is output to the microcode processor 1130 by the BIST state machine 1140 on bus 1142. Microcode processor 1130 may likewise output a corresponding status message via the JTAG interface 120. From block 380, the test procedure ends with the flow passing to block 450.

If in decision block 370 faults had been identified, then the next step is to determine whether repair of the faults are authorized in decision block 390. Such authorization is transmitted through the JTAG interface 120 during the upload step of block 310. If repairs are not to be made by the repair state machine 1150, then the flow passes to block 400 where the fault data is output to microcode processor 1130 on line 1142 and may be output therefrom via the JTAG interface 120. Subsequent to output of the fault data, the test procedure ends with the flow passing to block 450. If repairs are to be initiated, then the flow from decision block 390 passes to decision block 410. In block 410 it is determined by repair state machine 1150 whether the identified faults can be mapped to available redundant portions of the memory integrated circuit dice of memory 20. If the necessary substitutions cannot be made, the flow passes to block 400 to transmit the fault data and then terminates at block 450.

When it is determined in repair state machine 1150 that redundant memory portions can be substituted for those portions determined to be faulty, then the flow passes from decision block 410 to block 420. In block 420, the memory specific repair procedures for each detected fault are carried out by repair state machine 1150. Upon completion of the repair steps in block 420, the flow passes to block 430 where data representing the completion status of the repair procedure is transmitted on bus 1152 to microcode processor 1130, which in turn may output a corresponding status via the JTAG interface 120. From block 430 the flow passes to decision block 440 where it is determined whether the memory is to be retested following the repair, which determination may be carried out in microcode processor 1130 or external to SOC 10 and commands responsive to that decision transmitted via the JTAG interface 120. If the memory is to be completely retested, the flow passes back to block 330. Optionally, the flow can pass back to block 320 where a different test sequence may be uploaded for repair verification. If no retesting is to be performed, the repair procedure ends with the flow passing to block 450.

The descriptions above are intended to illustrate possible implementations of the present invention and are not restrictive. While this invention has been described in connection with specific forms and embodiments thereof, it will be appreciated that various modifications other than those discussed above may be resorted to without departing from the spirit or scope of the invention. Such variations, modifications, and alternatives will become apparent to the skilled artisan upon review of the disclosure. For example, functionally equivalent elements or method steps may be substituted for those specifically shown and described, and certain features may be used independently of other features, and in certain cases, particular locations of elements or sequence of method steps may be reversed or interposed, all without departing from the spirit or scope of the invention as defined in the appended Claims. The scope of the invention should therefore be determined with reference to the description above and the appended claims, along with their full range of equivalents.

What is claimed is:

1. A memory controller for use in a system-on-chip architecture connected to a memory formed by a plurality of stacked memory integrated circuit dies, the memory controller comprising an interface configured for coupling with the memory through a physical interface circuit, the memory controller including a built-in self-test system for testing the memory for defects and repair of the memory, said built-in self-test system including a self-test state machine sending data to the memory and reading data from the memory in sequential testing steps to detect defective portions of the memory, said sequential testing steps retrieved from a testing step lookup table according to a manufacturer testing specification defined for a memory type of a memory integrated circuit die being tested, said built-in self-test system accessing a nonvolatile memory having a multiplicity of repair steps contained within a repair step lookup table stored therein for repair of memory integrated circuit dies, a plurality of manufacturer-specified repair procedures each defined for a different memory type and each defining select ones of said multiplicity of stored repair steps, said built-in self-test system selecting repair steps from said multiplicity of stored repair steps, said built-in self-test system including a repair state machine executing said selected repair steps to substitute defective memory portions of the memory identified by the testing with redundant portions thereof, said selection being made according to a manufacturer specification defined for the memory type of a memory integrated circuit die containing said identified defective memory portions.

2. The memory controller as recited in claim 1, where said built-in self-test system includes said repair state machine for executing sequential repair steps to replace defective memory portions with redundant portions provided in the memory.

3. A memory controller for use in a system-on-chip architecture connected to a memory formed by a plurality of stacked memory integrated circuit dies, the memory controller comprising an interface configured for coupling with the memory through a physical interface circuit, the memory controller including a built-in self-test system for testing the memory for defects and repair of the memory, said built-in self-test system enabling substitution of defective memory portions of the memory identified by the testing with redundant portions thereof;

where said built-in self-test system includes a self-test state machine for executing sequential testing steps to detect defective portions of the memory, and a repair state machine for executing sequential repair steps to replace defective memory portions with redundant portions provided in the memory;

the self-test state machine retrieves said sequential testing steps from a testing step lookup table containing a multiplicity of testing steps to be carried out for testing of memory integrated circuit dies, a plurality of manufacturer-specified testing procedures each defined for a different memory type and each defining select ones of said multiplicity of testing steps, the sequential testing steps for the self-test state machine retrieved according to a manufacturer specification defined for the memory type of a memory integrated circuit die being tested; and, the repair state machine is coupled to a non-volatile memory having a repair step lookup table containing a multiplicity of repair steps to be carried out for repair of memory integrated circuit dies, a plurality of manufacturer-specified repair procedures each defined for a different memory type and each defining select ones of said multiplicity of repair steps, the sequential repair steps for the repair state machine retrieved from the repair step lookup table according to a manufacturer specification defined for the memory type of a memory integrated circuit die containing said identified defective memory portions.

4. The memory controller as recited in claim 3, where the repair state machine is coupled to a control processor, said control processor transmitting repair sequence data to said repair state machine including at least one address in said repair step lookup table.

5. The memory controller as recited in claim 4, where the control processor is coupled to a Joint Test Action Group (JTAG) interface of the system-on-chip architecture, at least a portion of said repair sequence data being sent to said control processor through said JTAG interface.

6. The memory controller as recited in claim 4, where said control processor is configured to analyze and map said defective memory portions and responsive thereto, transmit said repair sequence data to said repair state machine for execution of said sequential repair steps.

7. A system-on-chip having a built-in self test and repair function for use with a memory formed by a plurality of stacked memory integrated circuit dies, comprising:
   a control circuit;
   a physical interface coupled to the memory; and
   a memory controller coupled to said control circuit and said physical interface, the memory controller including a built-in self-test (BIST) module for testing the memory for defects and repair of the memory, said BIST module:
      retrieving a sequence of testing steps from a testing step lookup table, said built-in self-test module including a self-test state machine executing selected testing steps to identify defective portions of the memory, said retrieval being made according to a manufacturer specification for the memory type tested, and,
      accessing a nonvolatile memory having a multiplicity of repair steps stored therein for repair of memory integrated circuit dies, a plurality of manufacturer-specified repair procedures each defined for a different memory type and each defining select ones of said multiplicity of stored repair steps, said built-in self-test module selecting repair steps from said multiplicity of stored repair steps, said built-in self-test module including a repair state machine executing said selected repair steps to substitute redundant portions of the memory for defective memory portions thereof identified by the testing, said selection being made according to a manufacturer specification defined for the memory type of a memory integrated circuit die containing said identified defective memory portions.

8. The system-on-chip as recited in claim 7, where the memory controller includes:
   a control processor;
   a first state machine coupled to said control processor and said physical interface, said first state machine sending data to the memory and reading data from the memory in sequential steps to test the memory to detect defective memory portions thereof responsive to commands from said control processor; and
   a second state machine coupled to said control processor and said physical interface, said second state machine executing sequential repair steps to replace said defective memory portions with redundant portions provided in the memory responsive to commands from said control processor.

9. The system-on-chip as recited in claim 8, where said control processor is configured to analyze and map said defective memory portions and transmit repair sequence data to said second state machine for execution of said sequential repair steps.

10. A system-on-chip having a built-in self test and repair function for use with a memory formed by a plurality of stacked memory integrated circuit dies, comprising:
   a control circuit;
   a physical interface coupled to the memory; and,
   a memory controller coupled to said control circuit and said physical interface, the memory controller including a built-in self-test (BIST) module for testing the memory for defects and repair of the memory by enabling substitution of redundant portions of the memory for defective memory portions thereof identified by the testing, where the memory controller includes:
      a control processor;
      a first state machine coupled to said control processor and said physical interface, said first state machine sending data to the memory and reading data from the memory in sequential testing steps to test the memory to detect defective memory portions thereof responsive to commands from said control processor, the sequential testing steps retrieved from a testing step lookup table according to a manufacturer testing specification defined for a memory type of a memory integrated circuit die being tested;
      a second state machine coupled to said control processor and said physical interface, said second state machine executing sequential repair steps to replace said defective memory portions with redundant portions provided in the memory responsive to commands from said control processor; and,
      a nonvolatile memory coupled to said second state machine, said nonvolatile memory having a repair step lookup table stored therein containing a multiplicity of repair steps to be carried out for repair of memory integrated circuit dies, a plurality of manufacturer-specified repair sequences each defined for a different memory type and each defining select ones of said multiplicity of repair steps stored in said repair step lookup table to be carried out for the plurality of stacked memory integrated circuit dies forming the memory, the sequential repair steps for the second state machine retrieved from the repair step lookup table according to a manufacturer repair specification defined for the memory type of a memory integrated circuit die containing said identified defective memory portions.

* * * * *